United States Patent
Melanson et al.

(10) Patent No.: US 11,050,433 B1
(45) Date of Patent: Jun. 29, 2021

(54) USING A TRACKING SWITCHED-MODE POWER SUPPLY TO INCREASE EFFICIENCY OF A CURRENT DIGITAL-TO-ANALOG CONVERTER-BASED OUTPUT STAGE

(71) Applicant: Cirrus Logic International Semiconductor Ltd., Edinburgh (GB)

(72) Inventors: John L. Melanson, Austin, TX (US); Johann G. Gaboriau, Austin, TX (US); Lei Zhu, Austin, TX (US); Wai-Shun Shum, Austin, TX (US); Xiaofan Fei, Austin, TX (US); Leyi Yin, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/945,520

(22) Filed: Jul. 31, 2020

Related U.S. Application Data (60) Provisional application No. 62/944,974, filed on Dec. 6, 2019.

(51) Int. Cl.
| | | |
|---|---|---|
| *H03M 1/74* | (2006.01) | |
| *H02M 3/158* | (2006.01) | |
| *H04R 3/00* | (2006.01) | |
| *H03M 3/00* | (2006.01) | |

(52) U.S. Cl.
CPC .......... *H03M 1/742* (2013.01); *H02M 3/158* (2013.01); *H03M 3/30* (2013.01); *H04R 3/00* (2013.01)

(58) Field of Classification Search
CPC .......... H03M 1/742; H03M 3/30; H04R 3/00; H02M 3/158
USPC .................................................. 341/143–144
See application file for complete search history.

(56) References Cited

U.S. PATENT DOCUMENTS

| | | | |
|---|---|---|---|
| 7,903,010 B1 | 3/2011 | Melanson | |
| 7,956,782 B2 | 6/2011 | Werking | |
| 9,118,239 B2 * | 8/2015 | Xu | H02M 1/08 |
| 9,853,658 B1 | 12/2017 | Hsiao et al. | |

\* cited by examiner

*Primary Examiner* — Khai M Nguyen
(74) *Attorney, Agent, or Firm* — Jackson Walker L.L.P.

(57) ABSTRACT

A system may include a current digital-to-analog converter (IDAC) configured to convert a digital input signal into an output current signal and a switched-mode power supply configured to provide electrical energy in the form of a supply voltage to the IDAC for operation of the IDAC, the switched-mode power supply configured to track a voltage signal derived from the digital input current signal and generate the supply voltage based on the voltage signal and a voltage headroom above the voltage signal.

30 Claims, 7 Drawing Sheets

FIG. 8

USING A TRACKING SWITCHED-MODE POWER SUPPLY TO INCREASE EFFICIENCY OF A CURRENT DIGITAL-TO-ANALOG CONVERTER-BASED OUTPUT STAGE

RELATED APPLICATION

The present disclosure claims priority to U.S. Provisional Patent Application Ser. No. 62/944,974, filed Dec. 6, 2019, which is incorporated by reference herein in its entirety.

FIELD OF DISCLOSURE

The present disclosure relates in general to circuits for audio devices, including without limitation personal audio devices, such as wireless telephones and media players, and more specifically, to systems and methods relating to a current-mode output digital-to-analog converter with a high-impedance output.

BACKGROUND

Mobile devices, including wireless telephones, such as mobile/cellular telephones, cordless telephones, mp3 players, and other consumer audio devices, are in widespread use. Such mobile devices may include circuitry for driving a transducer, including without limitation, a headphone, a speaker, a linear resonant actuator or other vibrational actuator, and/or any other suitable transducer.

It may be desirable to drive an audio output transducer with source impedances as high or higher than the nominal impedance of the transducer. One example is that of a 30-ohm (nominal) transducer driven by a driver with a 30- to 300-ohm source impedance. Such arrangement has traditionally been accomplished by a low-impedance voltage source in combination with a series resistor. However, such approach lacks power efficiency—for each watt dissipated in the transducer load, 10 watts may be dissipated in the series resistor, severely limiting power efficiency of a system.

Another approach may be to use current-mode feedback to effectively boost the output impedance of the driver. While this approach may solve the efficiency problem described in the previous paragraph, the gain of the current feedback loop may lead to noise problems, and loop stability problems may arise when an output impedance is unknown.

Accordingly, circuit architectures that overcome these disadvantages are desired.

SUMMARY

In accordance with the teachings of the present disclosure, one or more disadvantages and problems associated with existing approaches to calibrating a digital-to-analog converter may be reduced or eliminated.

In accordance with embodiments of the present disclosure, a system may include a current digital-to-analog converter (IDAC) configured to convert a digital input signal into an output current signal and a switched-mode power supply configured to provide electrical energy in the form of a supply voltage to the IDAC for operation of the IDAC, the switched-mode power supply configured to track a voltage signal derived from the digital input current signal and generate the supply voltage based on the voltage signal and a voltage headroom above the voltage signal.

In accordance with these and other embodiments of the present disclosure, a method may include, in a system comprising a current digital-to-analog converter (IDAC) configured to convert a digital input signal into an output current signal and a switched-mode power supply configured to provide electrical energy in the form of a supply voltage to the IDAC for operation of the IDAC, tracking a voltage signal derived from the digital input current signal and generating the supply voltage based on the voltage signal and a voltage headroom above the voltage signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
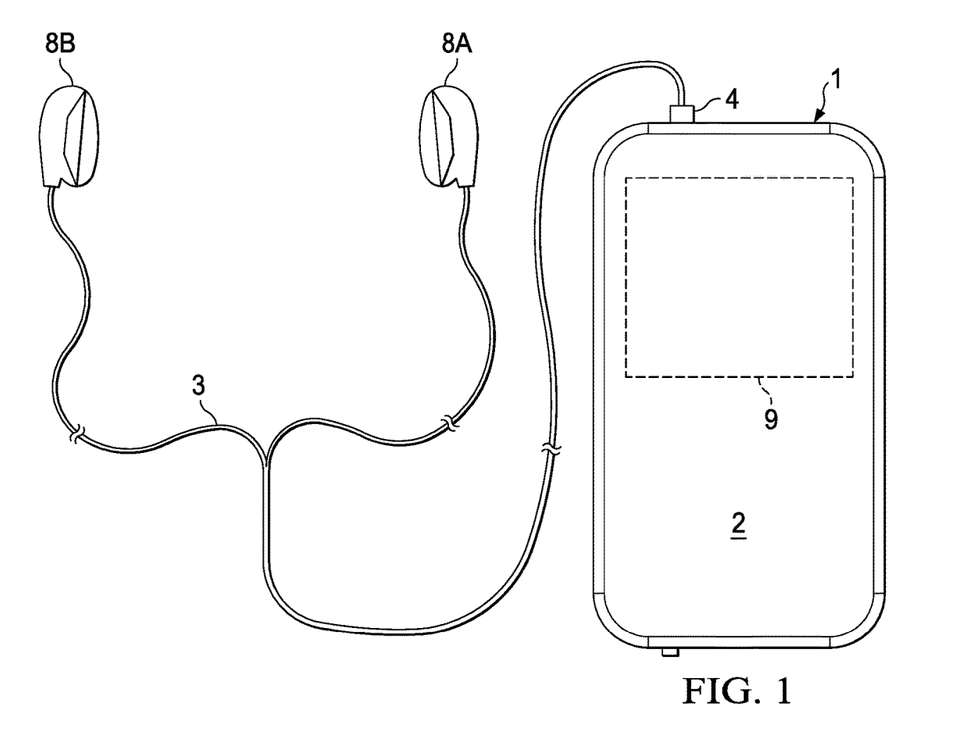
FIG. 1 is an illustration of an example personal audio device, in accordance with embodiments of the present disclosure.

FIG. 1 is an illustration of an example mobile device 1, in accordance with embodiments of the present disclosure.

FIG. 1 depicts mobile device 1 coupled to a headset 3 in the form of a pair of earbud speakers 8A and 8B. Headset 3 depicted in FIG. 1 is merely an example, and it is understood that mobile device 1 may be used in connection with a variety of audio transducers, including without limitation, headphones, earbuds, in-ear earphones, and external speakers. A plug 4 may provide for connection of headset 3 to an electrical terminal of mobile device 1. Mobile device 1 may provide a display to a user and receive user input using a touch screen 2, or alternatively, a standard liquid crystal display (LCD) may be combined with various buttons, sliders, and/or dials disposed on the face and/or sides of mobile device 1. As also shown in FIG. 1, mobile device 1 may include an audio integrated circuit (IC) 9 for generating an analog audio signal for transmission to headset 3 and/or another audio transducer.

Figure 2:
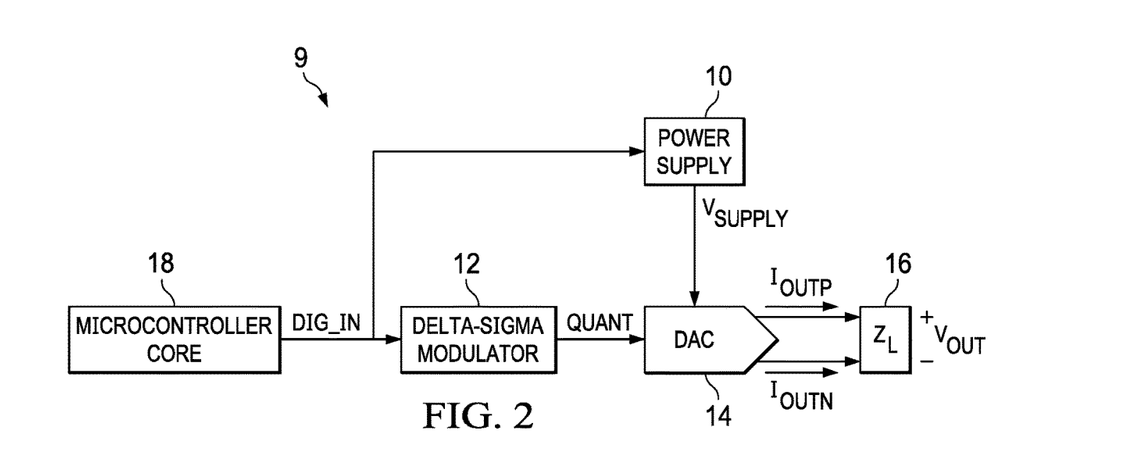
FIG. 2 is a block diagram of selected components of an example audio integrated circuit of a personal audio device, in accordance with embodiments of the present disclosure.

FIG. 2 is a block diagram of selected components of an example audio IC 9 of a mobile device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital delta-sigma modulator 12, which may convert it to a quantized (e.g., six-bit) signal QUANT at a sampling rate much higher than that of digital audio input signal DIG_IN (e.g., digital audio input signal DIG_IN may have a sampling rate of approximately 44 KHz and quantized signal QUANT may have a sampling rate of 1.6 MHz). Digital-to-analog converter (DAC) 14 may receive quantized signal QUANT which may convert quantized signal QUANT to a differential analog current-mode output signal equal to the difference between currents $I_{OUTP}$ and $I_{OUTN}$. DAC 14 may supply a differential analog current-mode input signal to an output transducer 16 having load impedance $Z_L$, such as one of earbud speakers 8A and 8B. A power supply 10 may provide the power supply rail inputs of DAC 14, and/or other components of audio IC 9. In some embodiments, power supply 10 may comprise a switched-mode power converter, as described in greater detail below.

Although FIGS. 1 and 2 depict an audio IC 9 for driving an audio transducer with a current-mode signal, it is understood that an IC similar or identical to audio IC 9 may be used to convert any suitable digital signal into a suitable output current signal for driving any suitable transducer, including non-audio transducers such as a linear resonant actuator or other suitable transducer. Further, the systems and methods described herein are not limited to mobile audio devices, and may also be used in video game controllers, touchscreens, automobiles, and any other device for which audio and/or haptic output is desirable.

Figure 3A:
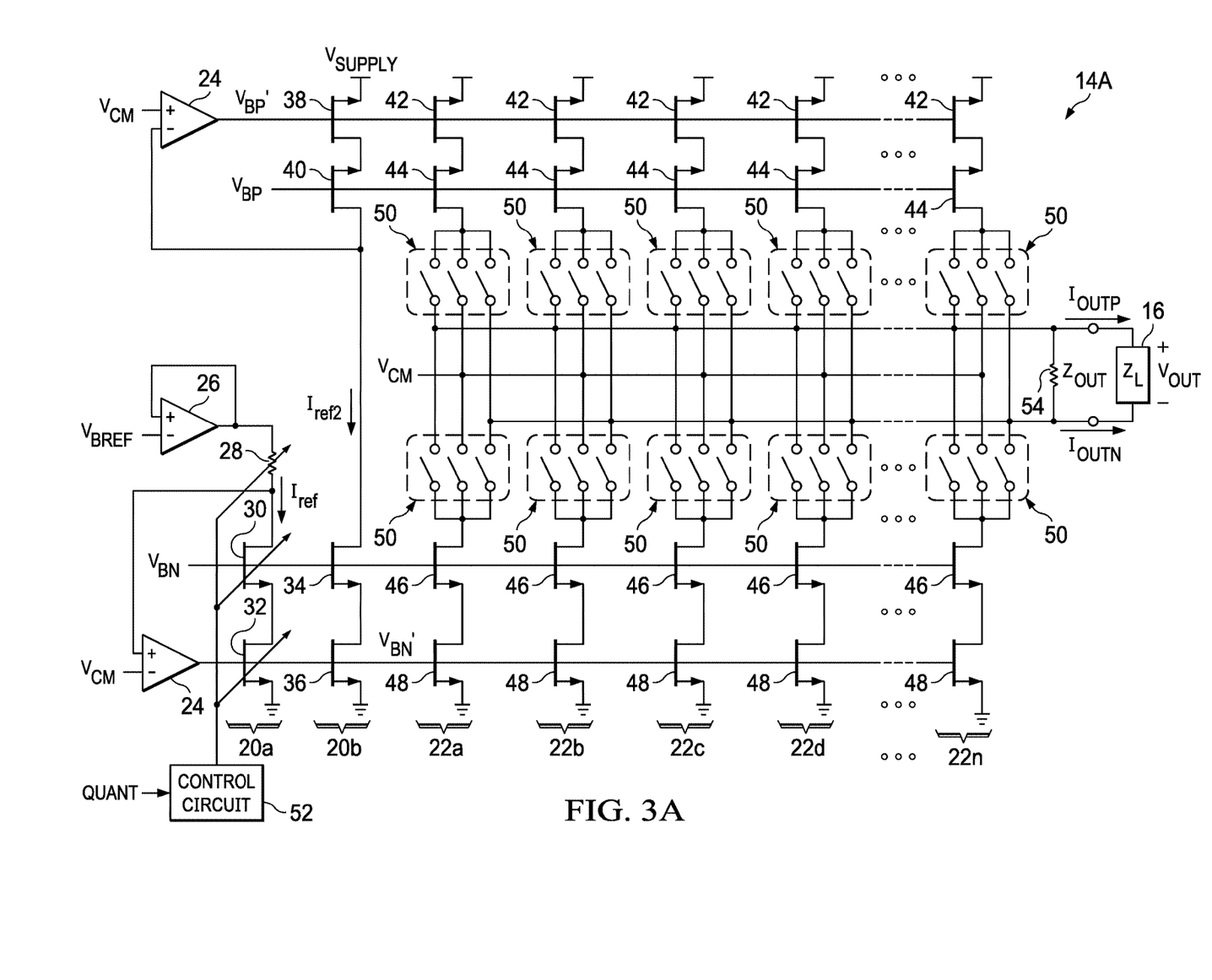
FIG. 3A is a circuit diagram of selected components of an example differential output current digital-to-analog converter (DAC) for use in the example audio integrated circuit of FIG. 2, in accordance with embodiments of the present disclosure.

FIG. 3A is a block diagram of selected components of an example differential output current DAC 14A which may be used to implement DAC 14 of example audio integrated circuit 9 of FIG. 2, in accordance with embodiments of the present disclosure. As shown in FIG. 3A, current DAC 14A may include one or more reference elements 20 (e.g., 20a, 20b), a plurality of current-mode DAC elements 22 (e.g., 22a, 22b, 22c, 22d, . . . , 22n), biasing operational amplifiers 24 and 26, a control circuit 52, and an output impedance 54 with impedance $Z_{OUT}$, coupled as depicted in FIG. 3A. When output transducer 16 is coupled to the output of current DAC 14A, output impedance 54 may be in parallel with impedance $Z_L$ of output transducer 16 as shown in FIG. 3A. Each DAC element 22 may comprise a differential current mirror comprising p-type field effect transistors 42 and 44, n-type field effect transistors 46 and 48, and a plurality of switches 50, coupled as shown in FIG. 3A.

Reference element 20a may comprise n-type field effect transistors 30 and 32 and a reference resistor 28 coupled as shown in FIG. 3A. As shown in FIG. 3A, reference resistor 28 may have a variable resistance controlled by control circuit 52. In addition or alternatively, one or both of n-type field effect transistors 30 and 32 may have an admittance controlled by control circuit 52. To implement an n-type field effect transistor 30 and/or 32 as a variable-admittance transistor, each such transistor may comprise a plurality of switched transistors that are enabled and/or disabled under the control of control circuit 52 in order to achieve the desired admittance. Reference element 20b may comprise n-type field effect transistors 34 and 36 and p-type field effect transistors 38 and 40, coupled as shown in FIG. 3A.

In operation, a reference bias voltage $V_{BREF}$ may be applied as shown to operational amplifier 26, and a common mode voltage $V_{cm}$ may be applied as shown to operational amplifiers 24 to generate bias voltages for biasing n-type field effect transistors 32, 36, and 48 and p-type field effect transistors 38 and 42. In addition, a p-type bias voltage $V_{BP}$ may be applied to gates of p-type field effect transistors 40 and 44 to bias p-type field effect transistors 40 and 44, and an n-type bias voltage $V_{BN}$ may be applied to gates of n-type field effect transistors 30, 34, and 46 to bias n-type field effect transistors 30, 34, and 46. Accordingly, as so biased, a circuit is formed by which reference elements 20a and 20b generate reference currents $I_{ref1}$ and $I_{ref2}$ as shown in FIG. 3A, one of which (e.g., reference current $I_{ref2}$) may be used as a reference current for the differential current mirrors implemented by each current-mode DAC element 22. Thus, at least one reference element 20 may have a current mirror relationship with each of the plurality of current-mode DAC elements 22 such that each individual current through each current-mode DAC element 22 is a scaled version of a reference current (e.g., reference currents $I_{ref1}$ and $I_{ref2}$) of the at least one reference element 20. For each current-mode DAC element 22, its respective switches 50 may be selectively enabled and disabled based on quantized signal QUANT. For purposes of clarity and exposition, the coupling of quantized signal QUANT and its individual bits to individual switches 50 is not shown. Accordingly, each current-mode DAC element 22 comprises a current source switched between one of the differential outputs (e.g., $I_{OUTP}$ or $I_{OUTN}$) or a common-mode ground (e.g., $V_{cm}$). Accordingly, output currents (e.g., $I_{OUTP}$ or $I_{OUTN}$) on each of the differential outputs may be the sum of current flowing into and out of the particular output from the individual current-mode DAC elements 22.

In some embodiments, each current-mode DAC element 22 may be sized or otherwise configured such that it generates a current which is a power of 2 greater than or less than another current-mode DAC element 22. For example, current-mode DAC element 22a may generate a current having twice the magnitude of the current generated by current-mode DAC element 22b, current-mode DAC element 22b may generate a current having twice the magnitude of the current generated by current-mode DAC element 22c, and so on. Therefore, in such embodiments, each current-mode DAC element 22 may correspond to a respective bit of quantized signal QUANT, and the respective switches 50 of a current-mode DAC element 22 may be selectively enabled and disabled based on the respective bit.

In other embodiments, each current-mode DAC element 22 may be sized or otherwise configured such that it generates a current which is approximately equal to all other current-mode DAC elements 22. Therefore, in such embodiments, control circuit 52 may decode quantized signal QUANT into a corresponding value, and the respective switches 50 of a current-mode DAC element 22 may be selectively enabled and disabled based on the corresponding value. For example, if quantized signal QUANT comprises six bits, current DAC 14A may comprise $2^6=64$ current-mode DAC elements 22, and respective switches 50 of current-mode DAC elements 22 may be enabled in accordance with the value corresponding to the digital code of quantized signal QUANT (e.g., for a six-bit code 000101, five current-mode DAC elements 22 may be enabled and 59 current-mode DAC elements 22 may be disabled).

Control circuit 52 may include any system, device, or apparatus configured to receive quantized signal QUANT (or another signal derived therefrom), and based on a characteristic (e.g., magnitude, frequency, etc.) of quantized signal QUANT, control one or more components of DAC 14A in order to scale current mirror ratios between at least one reference element 20 and the plurality of current-mode DAC elements 22. For example, control circuit 52 may modify current mirror ratios between at least one reference element 20 and the plurality of current-mode DAC elements 22 responsive to the magnitude of quantized signal QUANT crossing a predetermined threshold magnitude. As a specific example, in response to quantized signal QUANT crossing from above to below such predetermined threshold magnitude, control circuit 52 may control one or more components of DAC 14A to decrease a reference current (e.g., $I_{ref}$ and/or $I_{ref2}$) while increasing a scaling ratio of the currents of current-mode DAC elements 22 relative to a current of at least one reference element 20. In these and other embodiments, such predetermined threshold magnitude may be a threshold magnitude for entering or exiting a noise gating mode of the playback path of the audio signal, whereby noise gating involves, for low magnitudes of an audio input signal (e.g., quantized signal QUANT), an output signal (e.g., difference between $I_{OUTP}$ or $I_{OUTN}$) of an audio system forced to zero, so as to avoid audio output of noise present in the signal path.

In some embodiments, control circuit 52 may be configured to modify current mirror ratios between the at least one reference element 20 and the plurality of current-mode digital-to-analog elements 22 by modifying a resistance (e.g., resistance of variable resistor 28) of the at least one reference element for setting a current of the at least one reference element. In these and other embodiments, control circuit 52 may be configured to modify current mirror ratios between the at least one reference element 20 and the plurality of current-mode digital-to-analog elements 22 by modifying an effective device size (e.g., admittance) of the at least one reference element 20 (e.g., the effective admittance of one or both of n-type field effect transistors 30 or 32) for setting a current of the at least one reference element 20. Although, for the purposes of descriptive clarity, FIG. 3A shows n-type field effect transistors 34 and 36 and p-type field effect transistors 38 and 40 as not having variable admittances controllable by control circuit 52, in some embodiments, control circuit 52 may be configured to modify current mirror ratios between the at least one reference element 20 and the plurality of current-mode digital-to-analog elements 22 by modifying an effective device size of one or more of n-type field effect transistors 34 and 36 and p-type field effect transistors 38 and 40 in addition to or in lieu of modifying an effective device size of n-type field effect transistors 30 and/or 32. Because control circuit 52 may perform such scaling of current mirror ratios by modifying components of a reference element 20: (a) such scaling of current mirror ratios may be performed such that an amount of current flowing through the plurality of current-mode digital-to-analog elements 22 is unchanged when the ratios are scaled and such that the current flowing through the reference element 20 is changed; and/or (b) the plurality of current-mode digital-to-analog elements may be unchanged when the ratios are scaled.

In these and other embodiments, in order to reduce or eliminate audio artifacts associated with modifying current mirror ratios, control circuit 52 may modify current mirror ratios during one or more blanking windows of the audio playback path of audio IC 9, wherein each of the one or more blanking windows comprises a finite time duration within a sampling period of DAC 14A in which the output of DAC 14A is prevented from being transmitted to a downstream circuit (e.g., amplifier 16) coupled to the output.

Figure 3B:
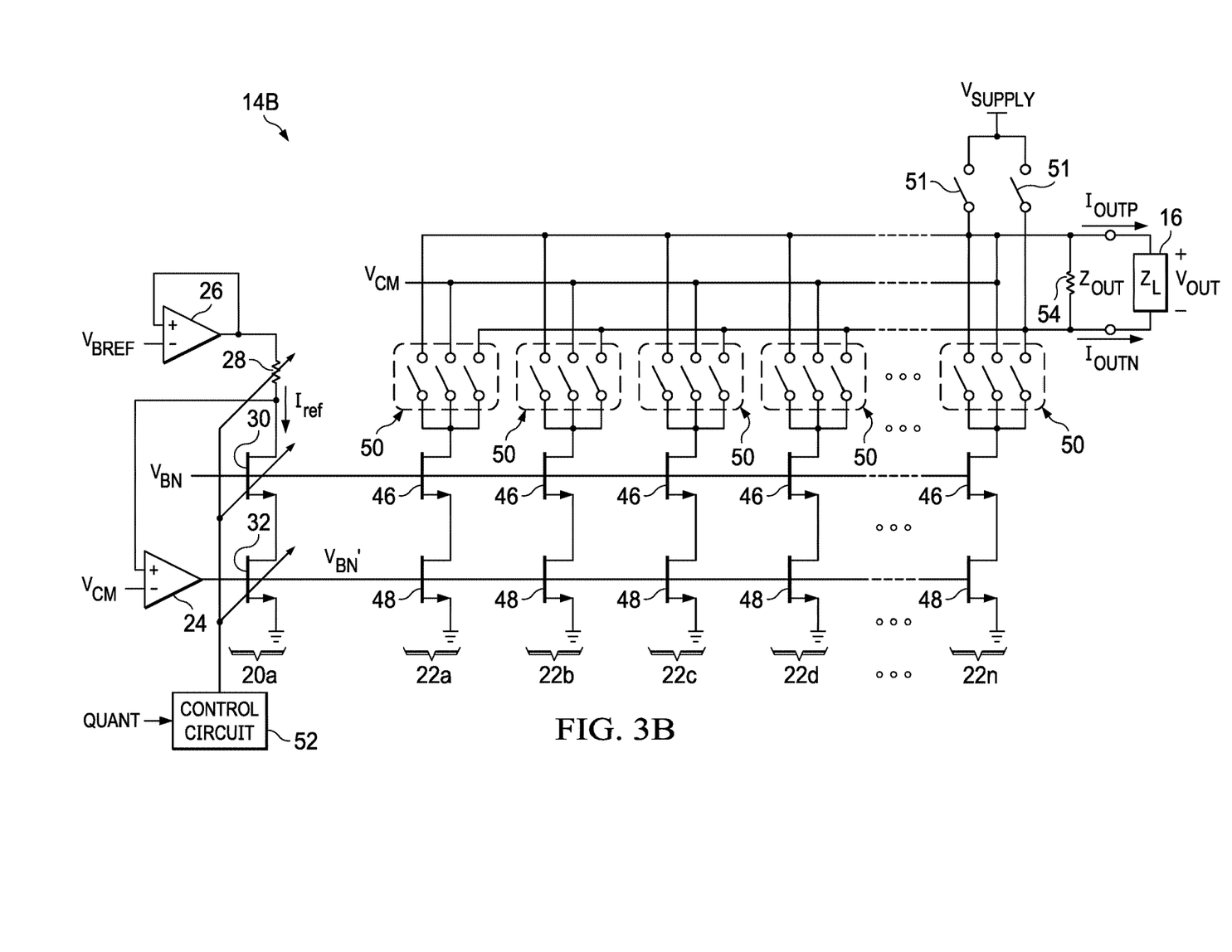
FIG. 3B is a circuit diagram of selected components of an example single-ended output current digital-to-analog converter (DAC) for use in the example audio integrated circuit of FIG. 2, in accordance with embodiments of the present disclosure.

FIG. 3B is a block diagram of selected components of an example single-ended output current DAC 14B which may be used to implement DAC 14 of example audio integrated circuit 9 of FIG. 2, in accordance with embodiments of the present disclosure. Current DAC 14B may be similar in many respects to current DAC 14A, and thus only selected differences between current DAC 14B and current DAC 14A may be discussed below. Notably, one main difference is that in current DAC 14B, the bottom half of each current-mode digital-to-analog element 22 may remain largely unchanged from FIG. 3A while the top halves of all current-mode digital-to-analog elements 22 may be replaced with a pair of polarity switches 51, such that one polarity switch 51 is enabled for positive output voltage $V_{OUT}$ and the other polarity switch 51 is enabled for negative output voltage $V_{OUT}$. Although not shown in the figures, in an alternative embodiment, the bottom half of current-mode digital-to-analog elements 22 may be replaced with a pair of polarity switches 51 while the top half of each current-mode digital-to-analog element 22 remains largely unchanged from FIG. 3A.

It is noted that FIGS. 3A and 3B represent example architectures for a current-mode DAC 14, and any other suitable architecture for a current-mode DAC may be used in accordance with this disclosure.

Using the architecture shown in FIGS. 2 and 3A and 3B, digital delta-sigma modulator 12 may receive digital audio input signal DIG_IN and convert it into quantized signal QUANT. Current-mode DAC 14 may convert quantized signal QUANT into a differential current signal represented by currents $I_{OUTP}$ or $I_{OUTN}$. If these current steps were applied directly to output transducer 16 (e.g., without presence of output impedance 54), resulting voltage spikes across output transducer 16 may limit an ability of DAC 14 to maintain accuracy and linearity. However, the presence of output impedance 54 in parallel with output transducer 16 (as opposed to in series, as may be the case with a voltage-mode output implementation) may limit such voltage spikes and maintain a reasonable voltage swing.

Any such voltage spike on output transducer 16 may be directly proportional to a step size of quantized signal QUANT generated by delta-sigma modulator 12. Accordingly, to further limit such voltage spike, delta-sigma modulator 12 may be configured to constrain the step size between successive output samples of quantized signal QUANT, for example as described in U.S. Pat. No. 7,903,010, which is incorporated by reference herein. For example, if a present quantized signal QUANT has a value of x, delta-sigma modulator 12 may limit the next output sample of quantized signal QUANT to the set {x−1, x, x+1} or {x−2, x−1, x, x+1, x+2}. Thus, assuming output impedance $Z_{OUT}$ of 300Ω (even though output impedance $Z_{OUT}$ may be of any impedance level), if the least-significant bit of DAC 14 generates a current of 100 μA, a voltage step may be equal to 100 μA×300Ω=30 mV in the case of quantized signal QUANT having a sample-to-sample constraint of changing by one quantization level, and equal to 200 μA×300Ω=60 mV in the case of quantized signal QUANT having a sample-to-sample constraint of changing by two quantization levels, which may be a small enough voltage spike in some applications to provide desired precision and accuracy.

As can be seen in FIGS. 3A and 3B, whenever a current-mode digital-to-analog element 22 is active, respective switches 50 of such digital-to-analog element 22 may be selectively enabled and disabled such that a path is created through one of such switches to one of the current-mode outputs of DAC 14A and DAC 14B. On the other hand, whenever a current-mode digital-to-analog element 22 is active, respective switches 50 of such digital-to-analog element 22 may be selectively enabled and disabled such that a path is created through one of such switches to common-mode voltage $V_{CM}$. Thus, for a six-bit, 64-element DAC, each set of switches 50 may include a pair of output-enabling switches and one "dump" switch for closing a path to common-mode voltage $V_{CM}$, meaning such a DAC would have 64 pairs of output-enabling switches and 64 dump switches. As an example, for a value of quantized signal QUANT equal to 5 in current DAC 14B, five switches of digital-to-analog elements 22 may be enabled to create a path to the output terminal for current $I_{OUT}$ and 59 switches of digital-to-analog elements 22 may be enabled to create a path to common-mode voltage $V_{CM}$.

Figure 4:
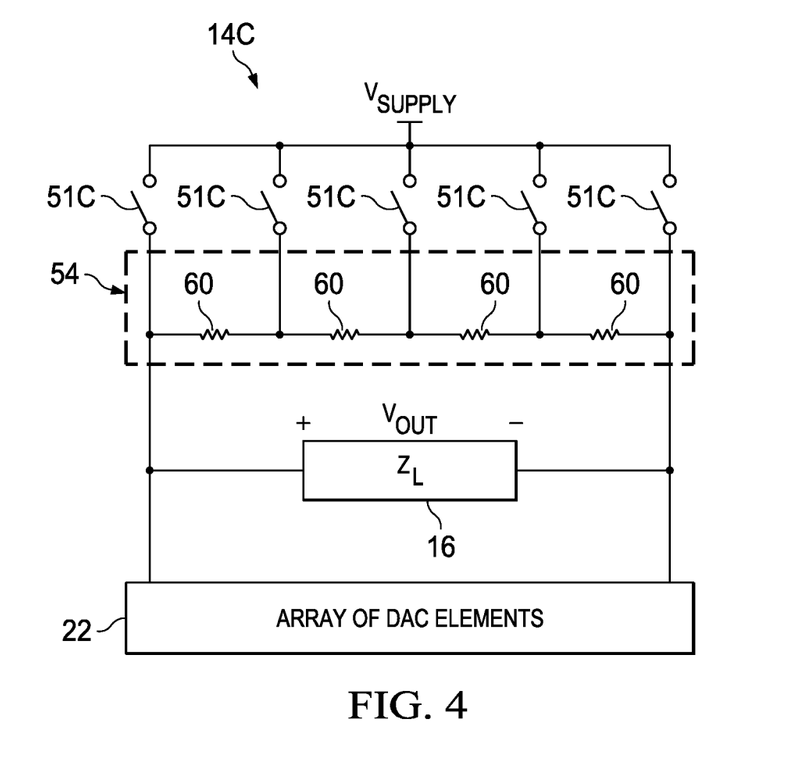
FIG. 4 is a circuit diagram of selected components of an example output impedance for a current DAC, in accordance with embodiments of the present disclosure.

One disadvantage of single-ended output current-mode DAC 14B shown in FIG. 3B is that transitioning an output voltage across output impedance 54 through zero volts may involve multiple changes of switches 50, which may be prone to non-linearity and inter-symbol interference, especially when the driving source is a delta-sigma modulator. To overcome this disadvantage, in some embodiments, output impedance 54 may be implemented by a plurality of impedance elements 60 and tapped via switches 51C (which may be present in lieu of polarity switches 51) to supply voltage $V_{SUPPLY}$, as shown in FIG. 4. At any given time, one switch 51C may be selectively enabled by control circuit 52. Values of output voltage $V_{OUT}$ between a quantization value of −1 and quantization value of +1 may be obtained by selectively enabling a particular switch 51C. Such approach may provide a smooth, low inter-symbol interference path through the digital codes corresponding to zero, and may allow for smaller quantization steps near zero, further minimizing possible distortion and noise sources. FIG. 4 depicts a single-ended output current-mode DAC 14C with output impedance 54 broken into four impedance elements 60 that, if equal in impedance, would allow for quantization levels of −1, −0.5, 0, +0.5, and +1. Dividing output impedance 54 into other numbers of impedance elements 60 may allow for different sized steps near zero. Further, in some embodiments, impedance elements 60 may have different values, allowing for non-uniform quantization levels even with identically-sized digital-to-analog elements 22.

By enabling different numbers of digital-to-analog elements 22 on each side of output impedance 54, use of a segmented, switch-tapped output impedance 54 as shown in FIG. 4 can allow for fine-tuned quantization in ranges other than near zero (e.g., +1, +1.5, +2).

A current source may require a sufficient voltage drop across it to operate accurately, wherein such sufficient voltage drop may also be referred to as a voltage headroom. To create sufficient voltage headroom while minimizing power consumption, switched-mode power supply 10 may track output signal $V_{OUT}$ and generate a supply voltage $V_{SUPPLY}$ sufficient to allow for linear and accurate operation of current-mode DAC 14, while maintaining a supply voltage $V_{SUPPLY}$ as small in magnitude as possible.

Figure 5:
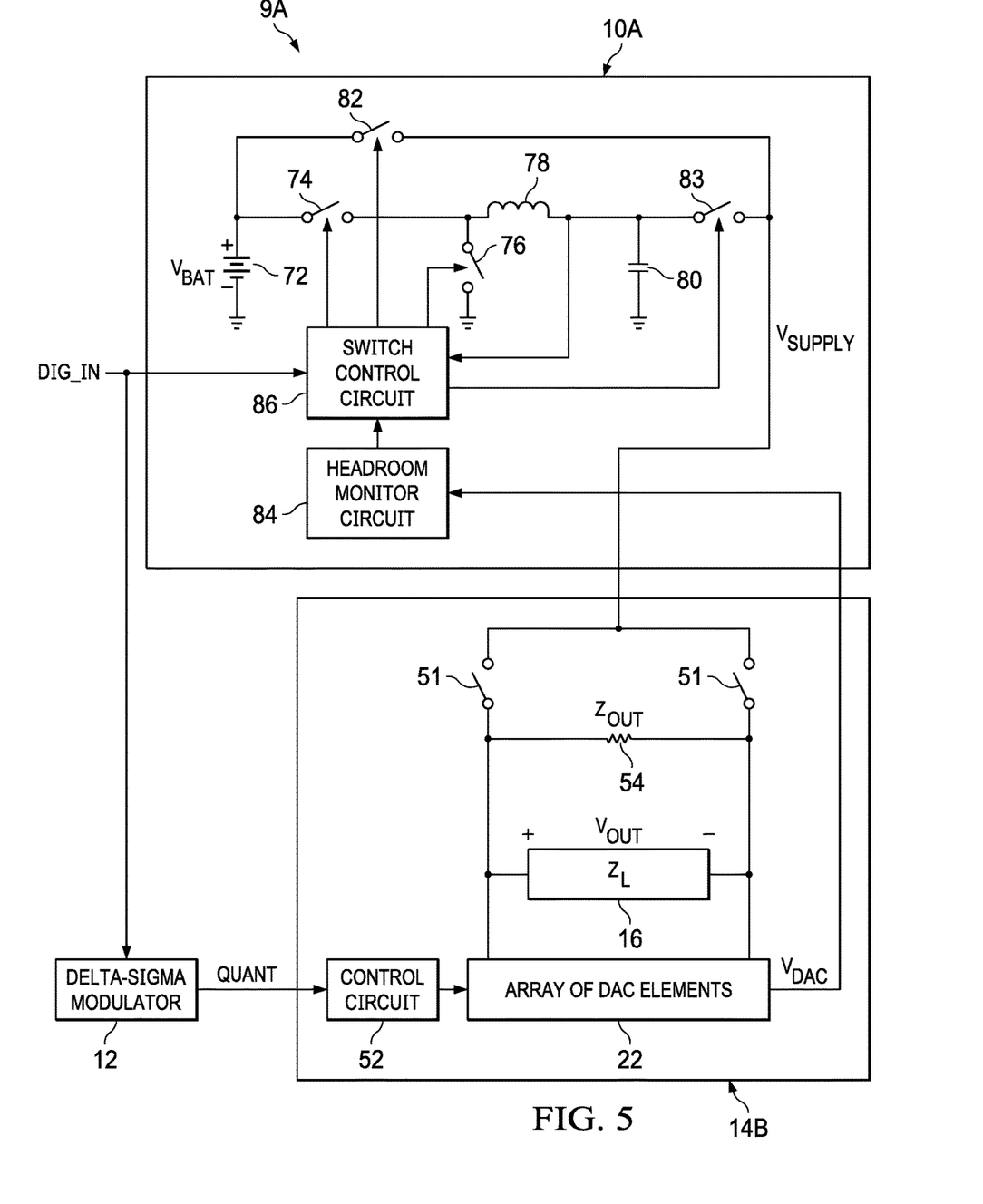
FIG. 5 is a block diagram of selected components of an example audio integrated circuit of a personal audio device showing selected detail of a switched-mode power supply, in accordance with embodiments of the present disclosure.

FIG. 5 is a block diagram of selected components of an example audio IC 9A showing selected detail of a switched-mode power supply 10A, in accordance with embodiments of the present disclosure. Audio IC 9A may be used to implement audio IC 9 and switched-mode power supply 10A may be used to implement switched-mode power supply 10. As shown in FIG. 5, switched-mode power supply 10A may be implemented as a buck power converter comprising a battery 72, a power inductor 78, converter switches 74 and 76, a buck capacitor 80, a bypass switch 82, a buck-mode switch 83, a headroom monitor circuit 84, and a switch control circuit 86. In operation, headroom monitor circuit 84 may receive a voltage $V_{DAC}$ indicative of a voltage across current sources of a current-mode DAC 14 (e.g., a cumulate voltage drop across transistors 46 and 48 or a cumulate voltage drop across transistors 42 and 44 of a digital-to-analog element 22), and based on such detected voltage $V_{DAC}$, switch control circuit 86 may cyclically commutate converter switches 74 and 76 to generate supply voltage $V_{SUPPLY}$ across buck capacitor 80 smaller than battery voltage $V_{BAT}$ of battery 72, such supply voltage $V_{SUPPLY}$ being a minimal magnitude that is of sufficient headroom to ensure linear and accurate operation of a current-mode DAC 14. To generate supply voltage $V_{SUPPLY}$, switch control circuit 86 may control a switching duty cycle of converter switches 74 and 76, a switching frequency of converter switches 74 and 76, and/or selective enabling and disabling of bypass switch 82, as described in greater detail below. The amount of headroom generated by switched-mode power supply 10A may be optimized for efficiency or audio accuracy, and such optimization may be varied dynamically, for example, based on program material, volume control setting, environmental noise, and/or a noise cancellation setting.

In operation, switched-mode power supply 10A may serve as a closed-loop, high-bandwidth power supply that tracks magnitude of desired output voltage $V_{OUT}$. In some embodiments, switched-mode power supply 10A may operate only in discontinuous conduction mode to maximize the bandwidth of tracking desired output voltage $V_{OUT}$.

In some embodiments, switch control circuitry 86 may use a feedback approach to track magnitude of desired output voltage $V_{OUT}$ based on detected voltage $V_{DAC}$ or by directly measuring desired output voltage $V_{OUT}$. In the same or other embodiments, switch control circuitry 86 may use a feedforward approach to track magnitude of desired output voltage $V_{OUT}$ based on digital audio input signal DIG_IN. In some embodiments, in the feedforward approach, switch control circuitry 86 may detect a slope of digital audio input signal DIG_IN in order to predict or estimate desired output voltage $V_{OUT}$.

In some embodiments, switch control circuitry 86 may implement a hybrid of a feedback and feedforward approach in order to maximize bandwidth of switched-mode power supply 10A. For example, a feedforward approach may be used to predict switching frequency based on signal power estimation, and the feedback approach may be used to control duty cycle based on supply voltage $V_{SUPPLY}$ compared to a reference voltage (e.g., detected voltage $V_{DAC}$ plus a headroom). As another example, the feedback approach may be used exclusively to control duty cycle based on supply voltage $V_{SUPPLY}$ compared to a reference voltage up to a duty cycle maximum, at which the feedforward approach may be used to control switching frequency.

In some instances, switch control circuit 86 may enable bypass switch 82 and disable buck-mode switch 83, thus bypassing battery voltage $V_{BAT}$ to supply voltage $V_{SUPPLY}$. For instance, such bypass may be used when operation of switched-mode power supply 10A without bypass is not able to increase supply voltage $V_{SUPPLY}$ to a required level of headroom, or when operation of switched-mode power supply 10A without bypass is unable to operate at a high enough bandwidth to track desired output voltage \Tour. Thus, in the case where it is impractical to slew supply voltage $V_{SUPPLY}$ of switched-mode power supply 10A, the buck stage implemented by converter switches 74 and 76 and power inductor 78 may be temporarily bypassed by bypass switch 82. When the slew of the buck stage implemented by converter switches 74 and 76 and power inductor 78 catches up to generate the necessary headroom, switch control circuit 86 may again enable buck-mode switch 83 and disable bypass switch 82. Such bypass mode may prevent voltage transients from degrading total harmonic distortion and noise of the system, at the cost of a small decrease in efficiency.

In addition or alternatively, switch control circuit 86 may enable bypass switch 82 and disable buck-mode switch 83, to bypass battery voltage $V_{BAT}$ to supply voltage $V_{SUPPLY}$ in order to maximize efficiency when desired supply voltage $V_{SUPPLY}$ is near battery voltage $V_{BAT}$.

In some embodiments, switch control circuit 86 may be capable of learning when such bypass events may occur, thus compensating supply voltage $V_{SUPPLY}$ for future cycles.

Figure 6:
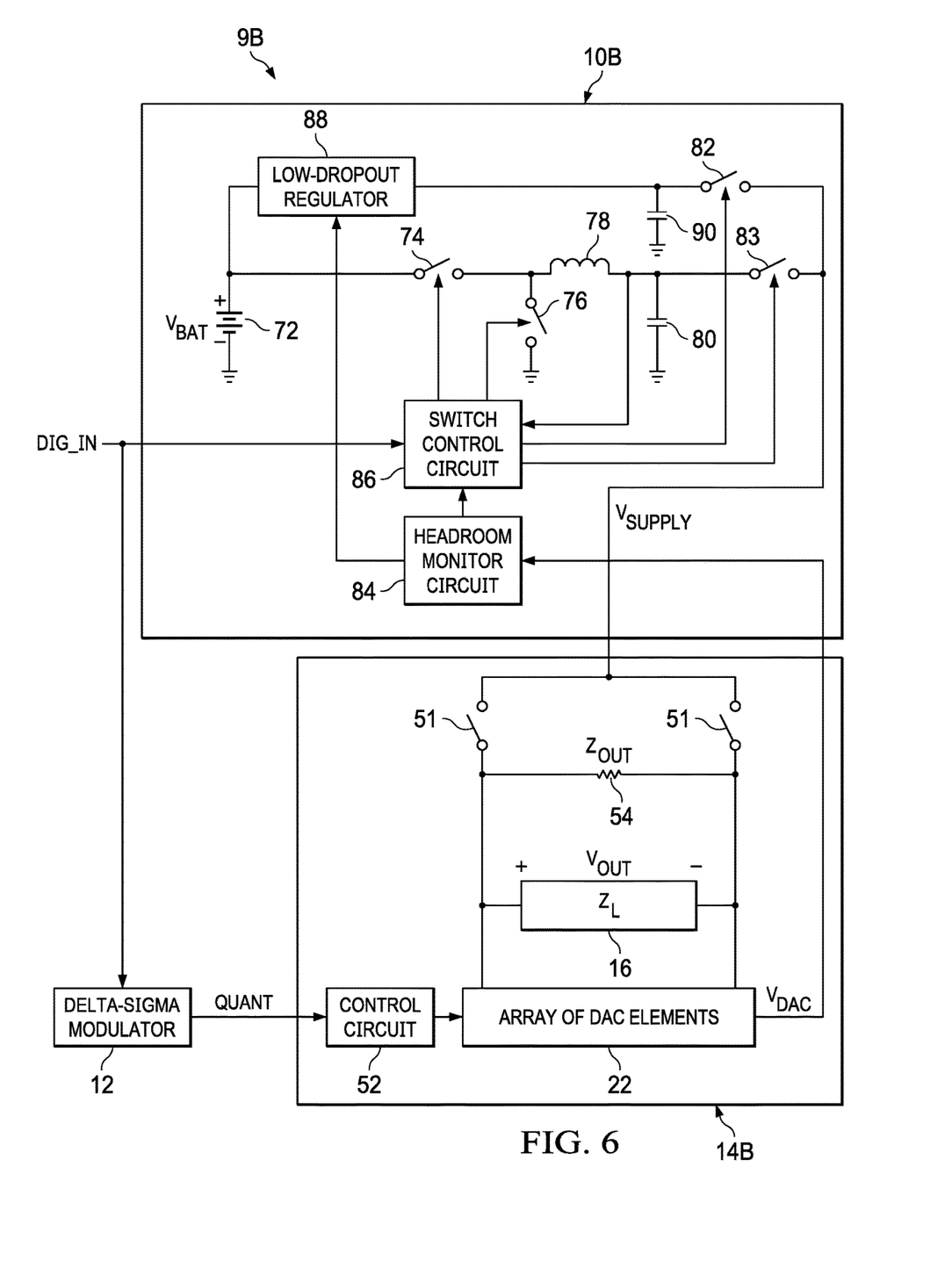
FIG. 6 is a block diagram of selected components of another example audio integrated circuit of a personal audio device showing selected detail of another switched-mode power supply, in accordance with embodiments of the present disclosure.

FIG. 6 is a block diagram of selected components of an example audio IC 9B showing selected detail of a switched-mode power supply 10B, in accordance with embodiments of the present disclosure. Audio IC 9B may be used to implement audio IC 9 and switched-mode power supply 10B may be used to implement switched-mode power supply 10. Switched-mode power supply 10B may operate in a manner similar to that of switched-mode power supply 10A, except as described below. As shown in FIG. 6, in some embodiments, the bypass path of switched-mode power supply 10B may include a low dropout regulator 88 (or other suitable voltage regulator) and a bulk capacitor 90. Low dropout regulator 88 may be set to generate a voltage across bulk capacitor 90 which assures adequate headroom. Use of such a bypass approach may allow switched-mode power supply 10B to maintain voltage steps of supply voltage $V_{SUPPLY}$ at a minimum, in order to increase audio quality.

For a large signal level, a switched-mode power supply 10 may not track to keep supply voltage $V_{SUPPLY}$ as low as possible. For example, if a 200 mV headroom is required, and a 1 V signal is being reproduced, supply voltage $V_{SUPPLY}$ may maintain a minimum of 400 mV of headroom when an instantaneous magnitude of desired output voltage $V_{OUT}$ is <400 mv. This minimum voltage maintenance may ease slew requirements for switched-mode power supply 10 and may compensate for phase shifts present in audio IC 9.

Figure 7:
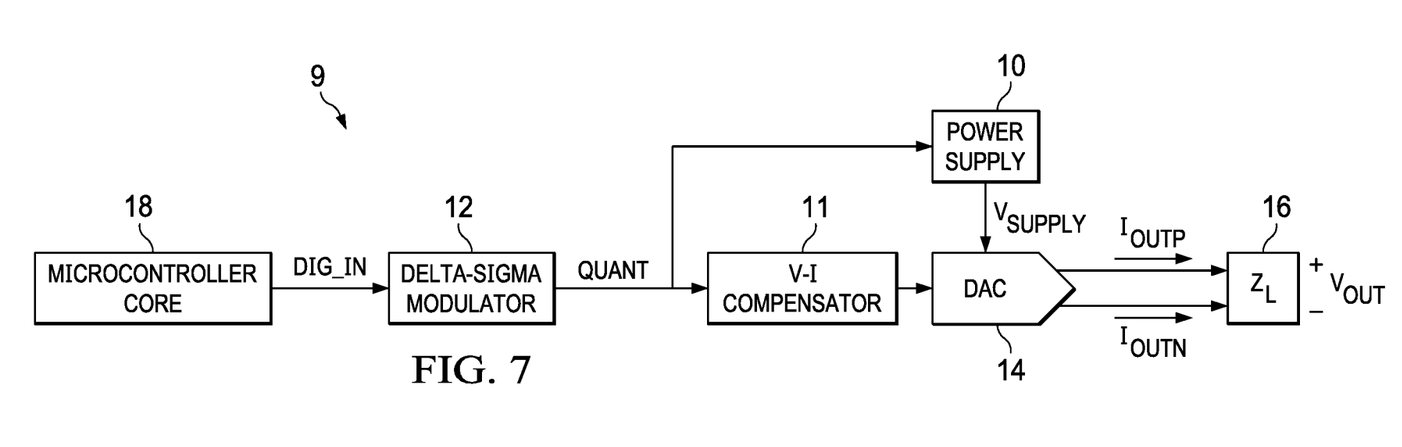
FIG. 7 is a block diagram of selected components of the example audio integrated circuit of FIG. 2 modified with voltage-to-current compensation for a load impedance, in accordance with embodiments of the present disclosure.

FIG. 7 is a block diagram of selected components of the example audio integrated circuit 9 as depicted in FIG. 2 and modified with a voltage-to-current compensator 11 configured to compensate for any phase shift between output voltage $V_{OUT}$ and output currents $I_{OUTP}$ and $I_{OUTN}$ (or output current $I_{OUT}$) caused by load impedance $Z_L$ of output transducer 16, in accordance with embodiments of the present disclosure. In some embodiments, voltage-to-current compensator 11 may be implemented by a filter function proportional to $1/Z_L$ that converts a voltage-mode signal received at the input of voltage-to-current compensator 11 to a current-mode signal at the output of voltage-to-current compensator 11.

Figure 8:
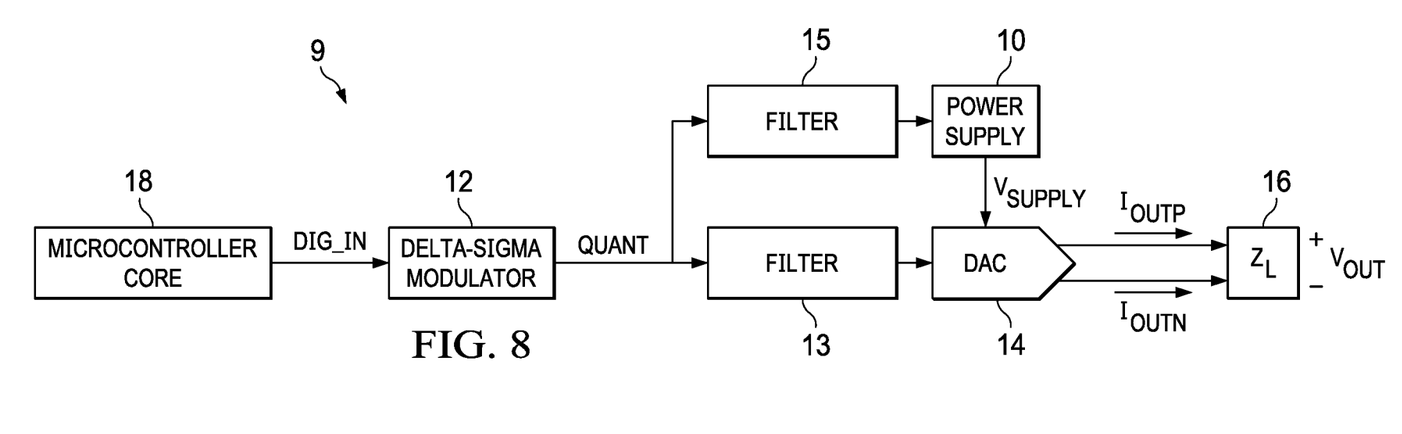
FIG. 8 is a block diagram of selected components of the example audio integrated circuit of FIG. 2 modified with filters to compensate for a load impedance, in accordance with embodiments of the present disclosure.

FIG. 8 is a block diagram of selected components of the example audio integrated circuit of FIG. 2 modified with filters 13 and 15 to compensate for any phase shift between output voltage $V_{OUT}$ and output currents $I_{OUTP}$ and $I_{OUTN}$ (or output current $I_{OUT}$) caused by load impedance $Z_L$ of output transducer 16, in accordance with embodiments of the present disclosure. In some instances, it may not be possible or desirable to invert all of a voltage signal to a current transform, in which case a filter 13 similar in function to voltage-to-current compensator 11 may be inserted in the signal path of audio IC 9 and a compensating filter 15 may be added to the level-detection input of switched-mode power supply 10. In operation, compensating filter 15 may estimate an actual output voltage $V_{OUT}$ for a present current drive $I_{OUTP}/I_{OUTN}$ to output transducer 16, and may have a function proportional to $HZ_L/Z_{OUT}$, wherein H is the function of filter 13. As used herein, when two or more elements are referred to as "coupled" to one another, such term indicates that such two or more elements are in electronic communication or mechanical communication, as applicable, whether connected indirectly or directly, with or without intervening elements.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a current digital-to-analog converter (IDAC) configured to convert a digital input signal into an output current signal; and
   a switched-mode power supply configured to provide electrical energy in the form of a supply voltage to the IDAC for operation of the IDAC, the switched-mode power supply configured to:
      track a voltage signal derived from the digital input current signal; and
      generate the supply voltage based on the voltage signal and a voltage headroom above the voltage signal.

2. The system of claim 1, wherein the IDAC comprises:
   a voltage-to-current filter to convert the digital input signal into a corresponding current signal; and
   IDAC elements configured to convert the corresponding current signal into the output current signal.

3. The system of claim 1, wherein the voltage signal is an output voltage signal generated from the output current signal.

4. The system of claim 1, wherein the switched-mode power supply operates solely in a discontinuous conduction mode.

5. The system of claim 1, wherein the switched-mode power supply is configured to track the voltage signal using a feedforward approach to determine a magnitude of the voltage signal based on the digital input signal and a slope of the digital input signal.

6. The system of claim 5, further comprising a voltage-to-current compensator in a signal path of the IDAC in order to compensate for phase shift between the output current signal and the voltage signal.

7. The system of claim 5, further comprising:
   a first filter in a feedforward path of the switched-mode power supply; and
   a second filter in a signal path of the IDAC;
   wherein the first filter and the second filter compensate for phase shift between the output current signal and the voltage signal.

8. The system of claim 5, wherein the switched-mode power supply is configured in a feedforward topology to predict a switching frequency of the switched-mode power supply based on the digital input current signal and a slope of the digital input current signal.

9. The system of claim 5, wherein the switched-mode power supply is configured in a feedforward topology to vary a duty cycle of the switched-mode power supply based on a comparison of an output voltage of the switched-mode power supply to a reference voltage.

10. The system of claim 1, wherein the switched-mode power supply is configured to track the voltage signal using a feedforward approach to determine a magnitude of the voltage signal based on signal outputs of a plurality of IDAC elements integral to the IDAC.

11. The system of claim 1, wherein the switched-mode power supply is configured to track the voltage signal using:
   a feedforward approach to determine a magnitude of the voltage signal based on signal outputs of a plurality of IDAC elements integral to the IDAC; and
   a feedforward approach to determine a magnitude of the voltage signal based on the digital input signal and a slope of the digital input signal.

12. The system of claim 1, wherein:
   the switched-mode power supply is further configured to convert a battery voltage of a battery into the supply voltage; and
   the integrated circuit further includes bypass circuitry configured to selectively bypass the switched-mode power supply to couple the battery voltage to the supply voltage.

13. The system of claim 12, wherein the bypass circuitry is configured to couple the battery voltage to the supply voltage via a low-dropout regulator coupled between the battery voltage and the supply voltage.

14. The system of claim 12, wherein the bypass circuitry is configured to couple the battery voltage to the supply voltage when the supply voltage is within a pre-determined magnitude of the battery voltage.

15. The system of claim 12, wherein the bypass circuitry is configured to couple the battery voltage to the supply voltage when a bandwidth of the switched-mode power supply is insufficient to allow the supply voltage to track the voltage signal.

16. A method comprising, in a system comprising a current digital-to-analog converter (IDAC) configured to convert a digital input signal into an output current signal and a switched-mode power supply configured to provide electrical energy in the form of a supply voltage to the IDAC for operation of the IDAC:
   tracking a voltage signal derived from the digital input current signal; and
   generating the supply voltage based on the voltage signal and a voltage headroom above the voltage signal.

17. The method of claim 16, further comprising:
   converting the digital input signal into a corresponding current signal with a voltage-to-current filter; and
   converting the corresponding current signal into the output current signal with IDAC elements.

18. The method of claim 16, wherein the voltage signal is an output voltage signal generated from the output current signal.

19. The method of claim 16, wherein the switched-mode power supply operates solely in a discontinuous conduction mode.

20. The method of claim 16, further comprising tracking the voltage signal using a feedforward approach to determine a magnitude of the voltage signal based on the digital input signal and a slope of the digital input signal.

21. The method of claim 20, further comprising compensating for phase shift between the output current signal and the voltage signal with a voltage-to-current compensator in a signal path of the IDAC.

22. The method of claim 20, further comprising compensating for phase shift between the output current signal and the voltage signal with a first filter in a feedforward path of the switched-mode power supply and a second filter in a signal path of the IDAC.

23. The method of claim 20, further comprising predicting a switching frequency of the switched-mode power supply based on the digital input current signal and a slope of the digital input current signal using a feedforward topology of the switched-mode power supply.

24. The method of claim 20, further comprising varying a duty cycle of the switched-mode power supply based on a comparison of an output voltage of the switched-mode power supply to a reference voltage using a feedforward topology of the switched-mode power supply.

25. The method of claim 16, further comprising tracking the voltage signal using a feedforward approach to determine a magnitude of the voltage signal based on signal outputs of a plurality of IDAC elements integral to the IDAC.

26. The method of claim 16, further comprising tracking the voltage signal using:

a feedforward approach to determine a magnitude of the voltage signal based on signal outputs of a plurality of IDAC elements integral to the IDAC; and a feedforward approach to determine a magnitude of the voltage signal based on the digital input signal and a slope of the digital input signal.

27. The method of claim 16, wherein:

the switched-mode power supply is further configured to convert a battery voltage of a battery into the supply voltage; and the method further comprises selectively bypassing the switched-mode power supply to couple the battery voltage to the supply voltage with bypass circuitry.

28. The method of claim 27, further comprising coupling the battery voltage to the supply voltage via a low-dropout regulator coupled between the battery voltage and the supply voltage and integral to the bypass circuitry.

29. The method of claim 27, further comprising coupling the battery voltage to the supply voltage when the supply voltage is within a pre-determined magnitude of the battery voltage using the bypass circuitry.

30. The method of claim 27, further comprising coupling, using the bypass circuitry, the battery voltage to the supply voltage when a bandwidth of the switched-mode power supply is insufficient to allow the supply voltage to track the voltage signal.

* * * * *

UNITED STATES PATENT AND TRADEMARK OFFICE
CERTIFICATE OF CORRECTION

PATENT NO. : 11,050,433 B1
APPLICATION NO. : 16/945520
DATED : June 29, 2021
INVENTOR(S) : Melanson et al.

It is certified that error appears in the above-identified patent and that said Letters Patent is hereby corrected as shown below:

In the Specification

1. In Column 4, Line 44, delete "(e.g., $V_{em}$)." and insert -- (e.g., $V_{cm}$). --, therefor.

2. In Column 6, Line 15, delete "amplifier 16)" and insert -- transducer 16) --, therefor.

3. In Column 9, Line 11, delete "\Tour." and insert -- $V_{OUT}$. --, therefor.

Signed and Sealed this
Twenty-second Day of November, 2022

Katherine Kelly Vidal
*Director of the United States Patent and Trademark Office*